United States Patent
Gealy et al.

[19]

[11] Patent Number: 6,082,375
[45] Date of Patent: Jul. 4, 2000

[54] METHOD OF PROCESSING INTERNAL SURFACES OF A CHEMICAL VAPOR DEPOSITION REACTOR

[75] Inventors: F. Daniel Gealy, Kuna; Husam N. Al-Shareef; Scott Jeffrey DeBoer, both of Boise, all of Id.

[73] Assignee: Micron Technology, Inc., Boise, Id.

[21] Appl. No.: 09/083,258

[22] Filed: May 21, 1998

[51] Int. Cl.[7] .................................................. C25F 3/12
[52] U.S. Cl. ........................ 134/1.1; 134/22.1; 216/37; 438/905; 34/493; 34/479
[58] Field of Search ............................. 134/1.1, 1.2, 1.3, 134/4, 21, 22.1, 31, 902; 427/299, 331; 216/37; 438/694, 758, 905, 911; 34/72, 104, 406, 437, 467, 476, 493, 497

[56] References Cited

U.S. PATENT DOCUMENTS

| | | | |
|---|---|---|---|
| 5,176,791 | 1/1993 | Itoh et al. ................................. | 216/81 |
| 5,283,087 | 2/1994 | Yamazaki et al. ....................... | 427/577 |
| 5,314,724 | 5/1994 | Tsukune et al. ......................... | 427/489 |
| 5,417,826 | 5/1995 | Blalock .................................... | 204/176 |
| 5,620,526 | 4/1997 | Watatani et al. ......................... | 134/1.1 |
| 5,679,211 | 10/1997 | Huang ..................................... | 438/697 |
| 5,861,065 | 1/1999 | Johnson .................................. | 134/22.1 |
| 5,939,831 | 8/1999 | Fong et al. .............................. | 315/111.21 |

*Primary Examiner*—Randy Gulakowski
*Assistant Examiner*—Allan Olsen
*Attorney, Agent, or Firm*—Wells, St. John, Roberts, Gregory & Matkin P.S.

[57] ABSTRACT

The invention encompasses methods of processing internal surfaces of a chemical vapor deposition reactor. In one implementation, material is deposited over internal surfaces of a chemical vapor deposition reactor while processing semiconductor substrates therein. The deposited material is treated with atomic oxygen. After the treating, at least some of the deposited material is etched from the reactor internal surfaces. In one embodiment, first etching is conducted of some of the deposited material from the reactor internal surfaces. After the first etching, remaining deposited material is treated with atomic oxygen. After the treating, second etching is conducted of at least some of the remaining deposited material from the reactor internal surfaces. In one embodiment, the deposited material is first treated with atomic oxygen. After the first treating, first etching is conducted of some of the deposited material from the reactor internal surfaces. After the first etching, second treating is conducted of remaining deposited material with atomic oxygen. After the second treating, second etching is conducted of at least some of the remaining deposited material from the reactor internal surfaces.

26 Claims, 1 Drawing Sheet

METHOD OF PROCESSING INTERNAL SURFACES OF A CHEMICAL VAPOR DEPOSITION REACTOR

TECHNICAL FIELD

This invention relates to methods of processing internal surfaces of a chemical vapor deposition reactor.

BACKGROUND OF THE INVENTION

Chemical vapor deposition reactors, with or without plasma, are commonly used in semiconductor processing to deposit layers over semiconductor wafers. This invention grew out of concerns associated with cleaning internal surfaces of such reactors, particularly after depositing $Ta_2O_5$ and other high K capacitor dielectric layers onto wafers received within the reactors. In the context of this document, "high K" means materials having a dielectric constant of at least 20.

Particularly, as DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs will be on the order of 0.25 micron, and conventional dielectrics such as $SiO_2$ and $Si_3N_4$ might not be suitable because of small dielectric constants.

Highly integrated memory devices, such as 256 Mbit DRAMs, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials, such as ferroelectric materials or perovskite material or pentoxides such as tantalum pentoxide, have high dielectric constants (K) and low leakage current which make them attractive as cell dielectric materials for high density DRAMs and non-volatile memories. Perovskite material and other ferroelectric materials exhibit a number of unique and interesting properties. One such property of a ferroelectric material is that it possesses a spontaneous polarization that can be reversed by an applied electric field. Specifically, these materials have a characteristic temperature, commonly referred to as the transition temperature, at which the material makes a structural phase change from a polar phase (ferroelectric) to a non-polar phase, typically called the paraelectric phase.

Chemical vapor deposition techniques commonly used in forming these high K and other oxygen containing dielectrics utilize organic precursors, such as metal organic and organometallic precursors. For example, FIG. 1 depicts a chemical vapor deposition reactor 10 having a circular plate or wafer platen 12 upon which a plurality of semiconductor wafers 14 is received. Wafer platen 12 is typically comprised of SiC. Reactor 10 includes one or more gas inlets 16 and one or more gas outlets 18. Precursor gases would be injected through inlet(s) 16 for achieving deposition of a desired layer atop wafers 14. For example where the deposition is for a high K $Ta_2O_5$ layer, low pressure chemical vapor deposition can be conducted utilizing $Ta(C_3H_5)_5$, $O_2$ and $N_2$ as precursor gases. Example flow rates are 120 sccm; 2–5 slm; and 2–5 slm, respectively. An example temperature is 410° C., with an example pressure being from 200 to 400 mTorr. Unfortunately, deposition in such systems also results in deposition not only over wafers 14, but also over SiC substrate 12 and other internal wafer surfaces. Typically at least monthly, the chamber needs to be cleaned to remove deposited dielectric material from the SiC platen 12 and other reactor surfaces.

One present technique for doing so includes an HF vapor etch at 400° C. for four hours. This etch is largely selective to etch $Ta_2O_5$ selectively relative to the typical SiC material of wafer platen 12. Such can, however, leave a black carbon residue atop internal reactor surfaces, typically emanating from the organic precursor used to deposit the $Ta_2O_5$, and which is not etched by the HF. The present conventional way for ridding the reactor surfaces of this organic material is by utilizing an $O_2$ burn, for example at 800° C.–850° C. at from 1 Torr to 10 Torr. Such effectively removes the carbon, and provides a clean deposition tool for subsequent processing of wafers.

Unfortunately, there are drawbacks associated with such processing. A first drawback is that the HF etch rate of the $Ta_2O_5$ material over the SiC substrate 12 is slower than desired. A second drawback concerns the subsequent extreme high temperature processing at 800+°C. for ridding the tool of carbon. These large deposition tools apparently can take as much as another week after cleaning to cool down and achieve stabilized temperatures during deposition of the material over the wafers. During this time period, deposition rate is impacted by as much as 25% of the desired thickness of the films being deposited, thus creating unpredictability and process complexity.

It would be desirable to at least partially overcome some of these problems.

SUMMARY OF THE INVENTION

The invention encompasses methods of processing internal surfaces of a chemical vapor deposition reactor. In one implementation, material is deposited over internal surfaces of a chemical vapor deposition reactor while processing semiconductor substrates therein. The deposited material is treated with atomic oxygen. After the treating, at least some of the deposited material is etched from the reactor internal surfaces. In one embodiment, first etching is conducted of some of the deposited material from the reactor internal surfaces. After the first etching, remaining deposited material is treated with atomic oxygen. After the treating, second etching is conducted of at least some of the remaining deposited material from the reactor internal surfaces. In one embodiment, the deposited material is first treated with atomic oxygen. After the first treating, first etching is conducted of some of the deposited material from the reactor internal surfaces. After the first etching, second treating is conducted of remaining deposited material with atomic oxygen. After the second treating, second etching is conducted of at least some of the remaining deposited material from the reactor internal surfaces.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A method of processing internal surfaces of a chemical vapor deposition reactor initially comprises depositing material over internal reactor surfaces while processing semiconductor wafers therein. Such depositing is preferably conducted utilizing chemical vapor deposition with or without plasma. Example materials with which the invention is believed to have its greatest applicability are oxygen-containing dielectric materials deposited utilizing organic precursors, such as organometallic and metal organic precursors. Most preferable, or where greatest utility is believed to be achieved, is the depositing of high K dielectric material using an organic precursor. Such materials, of course, deposit on internal surfaces of the reactor/chamber as well as onto the semiconductor wafers being processed. Example high K dielectric materials include $Ta_2O_5$, barium strontium titanate, strontium bismuth titanate, strontium titanate, and other oxide-containing high K dielectric materials. At some point, the buildup over internal surfaces of the reactor, such as over the wafer platen 12, becomes sufficiently great that wafer processing can be adversely affected. Accordingly, cleaning of the internal surfaces of the reactor chamber will occur at some point, typically while no semiconductor substrates are within the reactor.

Figure 1:
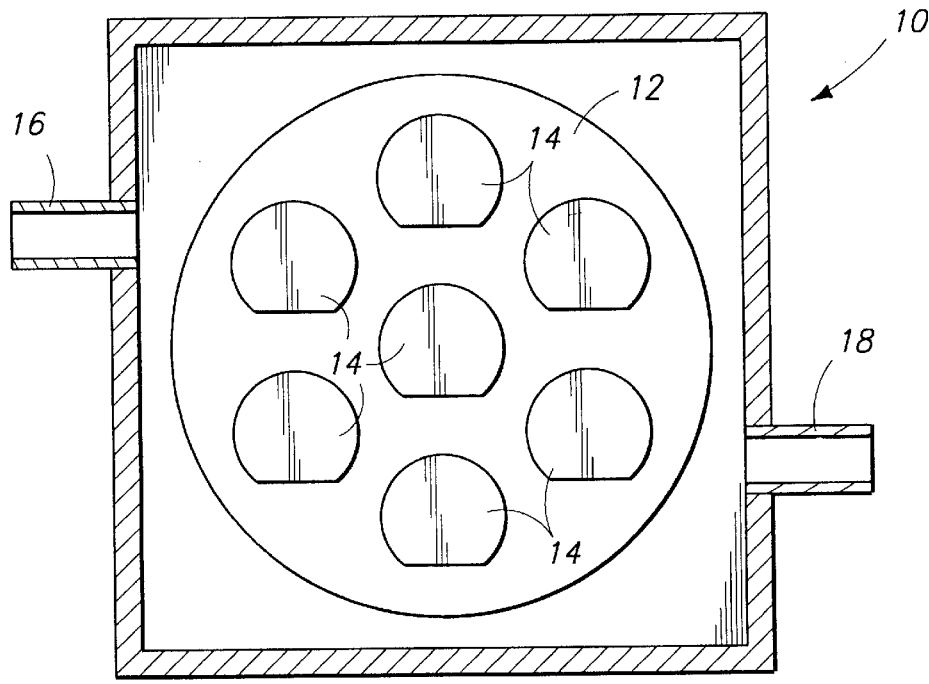
FIG. 1 is a diagrammatic horizontal sectional view of a chemical vapor deposition reactor system.
Figure 2:
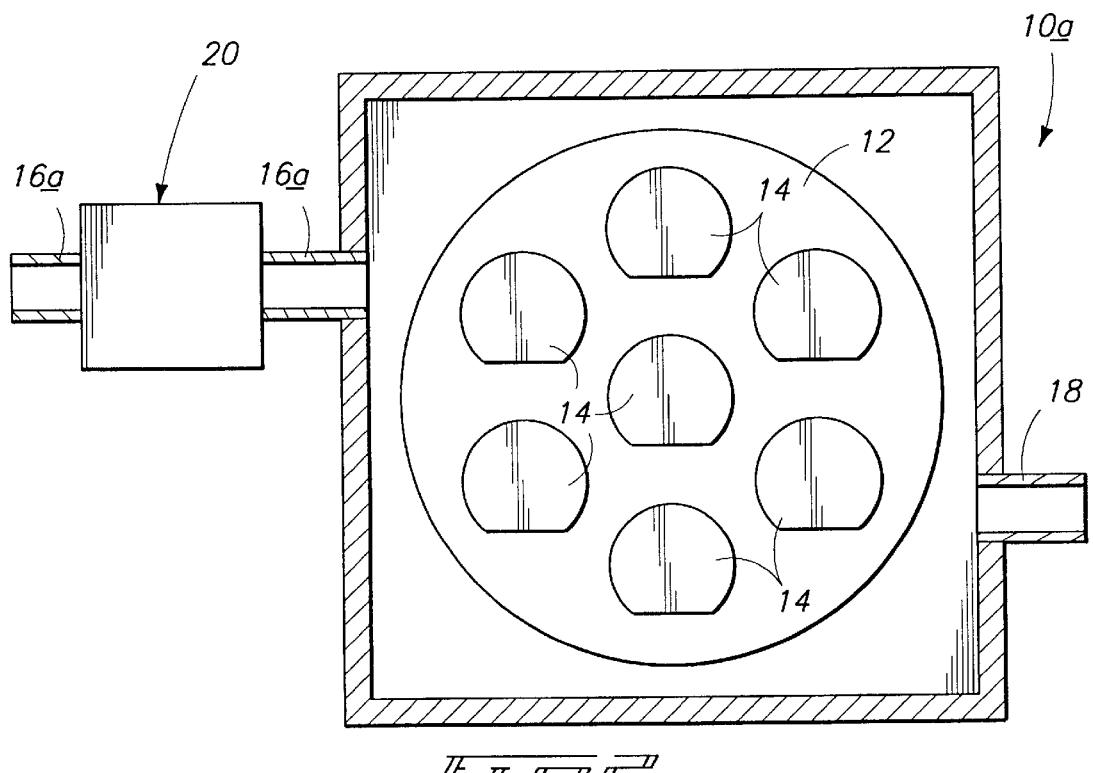
FIG. 2 is a diagrammatic horizontal sectional view of another chemical vapor deposition reactor system.

In accordance with a first preferred aspect of the invention, such a process includes treating the deposited material with atomic oxygen. Example sources for atomic oxygen treatment within the reactor include $O_3$, a compound comprising nitrogen and oxygen (i.e., $N_2O$, $NO_x$, etc.), and remote plasma treatment of an oxygen source provided within the reactor to provide atomic oxygen. For example, FIG. 2 illustrates a reactor 10a having a remote plasma generating station 20 provided within a gas line 16a for generating such a remote plasma. An oxygen containing remote plasma could be generated, for example, utilizing any of the oxygen containing gases referred to above. Most preferably, such a treatment effectively increases porosity in the deposited film, and accordingly subjects the layer to a faster etch rate during a subsequent etch.

The atomic oxygen treatment preferably is conducted at a temperature from about 250° C. to no higher than about 675° C., with a range of from 300° C. to 650° C. being more preferred. Most preferred is treating temperature at or below 500° C. Also preferred is a temperature the same as the dielectric layer deposition temperature. A preferred pressure range for the treatment is from 500 mTorr–760 Torr. The invention was reduced to practice wherein the deposited material was $Ta_2O_5$, with atomic oxygen being provided by feeding 12% by volume $O_3$ in an $O_3/O_2$ mix to a reactor provided at temperature of 410° C. and a pressure of 400 mTorr. Provision of such compounds, or other compounds, within the reactor under such temperature and pressure conditions effectively produces oxygen in an atomic form effective to achieve the desired treatment. An example time range for the pretreatment is from 0.5 to 1 hour.

After the above treating, which for purposes of the continuing discussion only is referred to as a "first" treating, at least some of the deposited material from the reactor is etched from the reactor internal surfaces. At least where the deposited material comprises an oxide, the etching preferably utilizes a fluorine containing chemistry and a temperature no higher than about 675° C., and even more preferably no greater than about 550° C. Example etching chemistries include HF, $NF_3$, or $ClF_3$. The previous first treatment can facilitate rate of the etching as well as degree of etching of such oxide material from the internal reactor surfaces. However, typically and in accordance with the prior art, some carbon containing residual can remain, particularly where the precursor for the deposition in the first place comprises organic materials.

Accordingly in another preferred aspect of the invention, the remaining deposited material is treated after the first etching, again with atomic oxygen. The preferred gases, treatments and parameters for this atomic oxygen treating are as described above for the first treating. Accordingly, the atomic oxygen of both the first and subsequent treatings can be derived from a same common source such as any one or combination of $O_3$, a nitrogen and oxygen containing compound, or remote plasma. Alternately, the atomic oxygen of the first and subsequent treatings can be derived from different respective sources of, for example, any one of $O_3$, or a nitrogen and oxygen compound.

After treating the remaining material, which is hereinafter referred to for convenience only as a "second treating", at least some and preferably all of the remaining deposited material is etched from the reactor internal surfaces. The preferred process for such etching is in part in accordance with the prior art, namely being an $O_2$ burn, but preferably at considerably lower temperatures than the prior art 850° C. Preferably, the $O_2$ etching is conducted at a temperature of no greater than about 675° C., and more preferably at a temperature no greater than about 550° C. Most preferably the temperature is kept at or below 500° C. during such etching. Accordingly, the internal surfaces of the reactor are preferably not exposed to a temperature greater than about 675° C. from the first treating through the second etching, more preferably not exposed to a temperature greater than 550° C. during such period, and most preferably not exposed to a temperature above 500° C. during such processing. Further preferably, no semiconductor substrate is received within the reactor from the first etching through the second etching. Further preferably, the preferred HF clean is done at the same temperature as the first treating.

The invention of course contemplates utilizing either one or both of first or second treatings as exemplified above.

The treating of the residual material, preferably as described above, facilitates carbon removal at lower temperatures than occurs in the conventional $O_2$ burn at 800° C.–850° C. Such can be utilized to prevent the reactor during clean from being subjected to the high temperatures of the prior art cleaning processes which produce difficulties in downstream processing control, such as achieving predictable and consistent subsequent deposition rates.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of processing internal surfaces of a chemical vapor deposition reactor comprising:

depositing material over internal surfaces of a chemical vapor deposition reactor while processing semiconductor substrates therein;

first etching some of the deposited material from the reactor internal surfaces;

after the first etching, treating remaining deposited material with atomic oxygen; and after the treating, second etching at least some of the remaining deposited material from the reactor internal surfaces, the second etching comprising exposing the internal surfaces to $O_2$ at a temperature from about 200° C. to not greater than about 550° C.

2. A method of processing internal surfaces of a chemical vapor deposition reactor comprising:

depositing material over internal surfaces of a chemical vapor deposition reactor while processing semiconductor substrates therein;

first etching some of the deposited material from the reactor internal surfaces;

after the first etching, treating remaining deposited material with atomic oxygen; and after the treating, second etching at least some of the remaining deposited material from the reactor internal surfaces, the first and second etchings being conducted only at temperatures of less than about 550° C.

3. A method of processing internal surfaces of a chemical vapor deposition reactor comprising:

depositing material over internal surfaces of a chemical vapor deposition reactor while processing semiconductor substrates therein;

first etching some of the deposited material from the reactor internal surfaces;

after the first etching, treating remaining deposited material with atomic oxygen;

after the treating, second etching at least some of the remaining deposited material from the reactor internal surfaces; and wherein the deposited material comprises an oxide, the first etching comprises a fluorine containing chemistry, and the second etching comprises exposing the internal surfaces to $O_2$ at a temperature from about 200° C. to not greater than about 550° C.

4. A method of processing internal surfaces of a chemical vapor deposition reactor comprising:

depositing material over internal surfaces of a chemical vapor deposition reactor while processing semiconductor substrates therein;

first etching some of the deposited material from the reactor internal surfaces;

after the first etching, treating remaining deposited material with atomic oxygen;

after the treating, second etching at least some of the remaining deposited material from the reactor internal surfaces; and wherein the treating comprises exposure to a temperature of from about 250° C. to about 675° C.

5. A method of processing internal surfaces of a chemical vapor deposition reactor comprising:

depositing material over internal surfaces of a chemical vapor deposition reactor while processing semiconductor substrates therein;

after the depositing, first treating the deposited material with atomic oxygen, there being no etching of the deposited material with fluorine after the depositing and prior to said first treating;

after the first treating, first etching some of the deposited material from the reactor internal surfaces;

after the first etching, second treating remaining deposited material with atomic oxygen; and after the second treating, second etching at least some of the remaining deposited material from the reactor internal surfaces.

6. The method of claim 5 wherein atomic oxygen of the first and second treatings is derived from a common source.

7. The method of claim 5 wherein atomic oxygen of the first and second treatings is derived from different sources.

8. The method of claim 5 wherein the atomic oxygen in at least one of the first and second treatings is derived from $O_3$ within the reactor.

9. The method of claim 5 wherein the atomic oxygen in at least one of the first and second treatings is derived from a compound within the reactor comprising nitrogen and oxygen.

10. The method of claim 5 wherein the atomic oxygen in at least one of the first and second treatings is derived from a remote plasma.

11. The method of claim 5 wherein the deposited material comprises an oxide, and the etching comprises a fluorine containing chemistry.

12. The method of claim 5 wherein the first treating, the second treating, the first etching and the second etching occur while no semiconductor substrate is within the reactor.

13. A method of processing internal surfaces of a chemical vapor deposition reactor comprising:

depositing material over internal surfaces of a chemical vapor deposition reactor while processing semiconductor substrates therein;

first treating the deposited material with atomic oxygen;

after the first treating, first etching some of the deposited material from the reactor internal surfaces;

after the first etching, second treating remaining deposited material with atomic oxygen;

after the second treating, second etching at least some of the remaining deposited material from the reactor internal surfaces; and wherein the internal surfaces are not exposed to a temperature of greater than about 675° C. from the first treating through the second etching.

14. A method of processing internal surfaces of a chemical vapor deposition reactor comprising:

chemical vapor depositing an oxygen containing dielectric material over internal surfaces of a chemical vapor deposition reactor while processing semiconductor substrates therein using an organic precursor;

first etching some of the dielectric material from the reactor internal surfaces;

after the first etching, treating carbon containing residuals deposited on the internal surfaces from the organic precursor at less than or equal to about 675° C.;

after the treating, second etching carbon containing residual material from the reactor internal surfaces only at a temperature no greater than about 550° C.

15. The method of claim 14 wherein the high K oxygen containing dielectric material comprises $Ta_2O_5$.

16. The method of claim 14 wherein the treating comprises exposing the carbon containing residuals to atomic oxygen.

17. The method of claim 14 wherein the first etching comprises a fluorine containing chemistry.

18. The method of claim 14 wherein the first etching comprises a fluorine containing chemistry and the second etching does not.

19. The method of claim 14 wherein the internal surfaces are not exposed to a temperature of greater than about 675° C. from the first treating through the second etching.

20. A method of processing internal surfaces of a chemical vapor deposition reactor comprising:

chemical vapor depositing an oxygen containing dielectric material over internal surfaces of a chemical vapor deposition reactor while processing semiconductor substrates therein using an organic precursor;

first treating the deposited material with atomic oxygen at a temperature from about 250° C. to no higher than about 675° C.;

after the first treating, first etching some of the deposited material from the reactor internal surfaces using a fluorine containing chemistry at a temperature no higher than about 675° C.;

after the first etching, second treating remaining deposited material with atomic oxygen at a temperature from about 250° C. to no greater than about 675° C.; and after the second treating, second etching carbon containing residual material from the reactor internal surfaces at a temperature no greater than about 550° C. in an $O_2$ comprising atmosphere.

21. The method of claim 20 wherein atomic oxygen of the first and second treatings is derived from a common source.

22. The method of claim 20 wherein atomic oxygen of the first and second treatings is derived from different sources.

23. The method of claim 20 wherein the atomic oxygen in at least one the first and second treatings is derived from $O_3$ within the reactor.

24. The method of claim 20 wherein the atomic oxygen in at least one the first and second treatings is derived from a compound within the reactor comprising nitrogen and oxygen.

25. The method of claim 20 wherein the atomic oxygen in at least one the first and second treatings is derived from a remote plasma.

26. The method of claim 20 wherein the first treating, the second treating, the first etching and the second etching occur while no semiconductor substrate is within the reactor.

* * * * *